United States Patent
Alexander et al.

(10) Patent No.: US 8,880,365 B2
(45) Date of Patent: Nov. 4, 2014

(54) SYSTEM AND METHOD FOR GENERATING AN ENERGY USAGE PROFILE FOR AN ELECTRICAL DEVICE

(75) Inventors: George William Alexander, Marietta, GA (US); John Christopher Boot, Atlanta, GA (US)

(73) Assignee: General Electric Company, Schenectady, NY (US)

( * ) Notice: Subject to any disclaimer, the term of this patent is extended or adjusted under 35 U.S.C. 154(b) by 82 days.

(21) Appl. No.: 13/047,596

(22) Filed: Mar. 14, 2011

(65) Prior Publication Data
US 2012/0239212 A1 Sep. 20, 2012

(51) Int. Cl.
*G01R 21/00* (2006.01)
*G01R 19/25* (2006.01)
*G01R 21/133* (2006.01)
*G01D 4/00* (2006.01)

(52) U.S. Cl.
CPC ............ *G01R 19/2513* (2013.01); *Y02B 90/241* (2013.01); *Y02B 90/248* (2013.01); *Y04S 20/32* (2013.01); *Y02B 70/3266* (2013.01); *Y02B 90/245* (2013.01); *Y04S 20/52* (2013.01); *Y04S 20/40* (2013.01); *G01R 21/133* (2013.01); *Y04S 20/242* (2013.01); *Y04S 20/38* (2013.01); *G01D 4/002* (2013.01)
USPC .......................................................... 702/60

(58) Field of Classification Search
USPC ........... 702/57, 60, 64, 66–68, 70, 71, 73, 83, 702/179, 182, 188; 700/295, 296
See application file for complete search history.

(56) References Cited

U.S. PATENT DOCUMENTS

| 6,419,454 | B1 | 7/2002 | Christiansen |
| 7,242,114 | B1 | 7/2007 | Cannon et al. |
| 2008/0157938 | A1 | 7/2008 | Sutardja |
| 2009/0045804 | A1* | 2/2009 | Durling et al. ............ 324/140 R |
| 2010/0070103 | A1 | 3/2010 | Fleck et al. |
| 2010/0070217 | A1* | 3/2010 | Shimada et al. ................ 702/62 |
| 2010/0131117 | A1* | 5/2010 | Mattiocco et al. ............ 700/295 |
| 2011/0046904 | A1* | 2/2011 | Souilmi ........................... 702/62 |
| 2011/0106316 | A1* | 5/2011 | Drew et al. .................... 700/278 |
| 2011/0184574 | A1* | 7/2011 | Le Roux et al. ............... 700/291 |
| 2011/0231320 | A1* | 9/2011 | Irving .............................. 705/80 |
| 2012/0078547 | A1* | 3/2012 | Murdoch ......................... 702/62 |

* cited by examiner

*Primary Examiner* — Mohamed Charioui
(74) *Attorney, Agent, or Firm* — Armstrong Teasdale LLP

(57) ABSTRACT

A system for generating an energy usage profile of an electrical device is provided. The system includes a meter configured to measure electric energy usage; a memory area for storing an energy usage profile corresponding to one or more electrical devices associated with the electric meter, and at least one processor. The at least one processor is programmed to receive a request to turn off power to each of the one or more electrical devices associated with the meter, receive a request to turn on a first electrical device of the one or more electrical devices, obtain a ramp up waveform of energy usage of the first electrical device, convert the ramp up waveform to a digital signature, and store the ramp up digital signature of the first electrical device in the memory area.

20 Claims, 3 Drawing Sheets

US 8,880,365 B2

SYSTEM AND METHOD FOR GENERATING AN ENERGY USAGE PROFILE FOR AN ELECTRICAL DEVICE

BACKGROUND OF THE INVENTION

The field of the disclosure relates generally to measuring electric energy consumption, and more specifically to a system and method for generating an energy usage profile for an electrical device.

To ensure that an amount of electricity generated by an electrical utility is sufficient to meet a load demand placed on a system by their customers, the utility must continually manage their capacity. Utilities generally have two options for meeting demands on the system during periods of peak energy demand (loading). These include either bringing additional generating capacity on-line to satisfy the increased demand, or, if properly equipped, shedding load across their customer base to reduce overall demand on the system.

When reducing demand, it is desirable to equitably distribute a necessary load shedding across the customer base. This is especially true where participation in load control programs is voluntary. In this regard, a number of methods have been proposed to manage load control fairly across a wide range of customers and their individual needs. These methods make use of demand and/or rate of demand as measured at a customer's site. This amount of "dispatchable" load, for example, usage that can be shed at a given time, is calculated from these measurements and then used to formulate set points and/or generate control signals which directly affect the shedding of a load.

Currently, to measure demand at a site, either a demand type metering device must be used, or a similar demand metering capability must be present in a load control device employed at that location. While some utilities may only employ demand measuring capability for a short time (e.g., until robust models are developed), even a short term deployment of a measuring capability may not only be cost prohibitive, but also require additional levels of system management. Furthermore, measuring usage at a premise level does not provide an indication of usage patterns at an equipment level. The result is that control signals meant to control individual loads are based on global measurements that have been taken and which are applied equally across all controlled loads. Generally speaking, utilities are primarily concerned with usage on an aggregate level, and individual equipment level data is not considered.

BRIEF DESCRIPTION OF THE INVENTION

In one aspect, a system for generating an energy usage profile of an electrical device is provided. The system includes a meter configured to measure electric energy usage; a memory area for storing an energy usage profile corresponding to one or more electrical devices associated with the electric meter, and at least one processor. The at least one processor is programmed to receive a request to turn off power to each of the one or more electrical devices associated with the meter, receive a request to turn on a first electrical device of the one or more electrical devices, obtain a sample of a ramp up waveform of energy usage of the first electrical device, convert the sample of the ramp up waveform to a digital signature, and store the ramp up digital signature of the first electrical device in the memory area.

In another aspect, a method is provided. The method includes receiving a request to turn off power to each of one or more electrical devices associated with a meter configured to measure electric energy usage, receiving a request to turn on a first electrical device of the one or more electrical devices, obtaining a sample of a ramp up waveform of energy usage of the first electrical device, converting the sample of the ramp up waveform to a digital signature, and storing the ramp up digital signature of the first electrical device in the memory area.

In yet another aspect, one or more computer-readable media having computer-executable components are provided. The components include an interface component that when executed by at least one processor causes the at least one processor to receive a request to turn off power to each of one or more electrical devices associated with a meter configured to measure electric energy usage, and receive a request to turn on a first electrical device of the one or more electrical devices, a sampling component that when executed by at least one processor causes the at least one processor to obtain a sample of a ramp up waveform of energy usage of the first electrical device, a converting component that when executed by at least one processor causes the at least one processor to convert the sample of the ramp up waveform to a digital signature, and a memory component that when executed by at least one processor causes the at least one processor to store the ramp up digital signature of the first electrical device in the memory area.

BRIEF DESCRIPTION OF THE DRAWINGS

The present disclosure is described in detail below with reference to the attached drawing figures.

DETAILED DESCRIPTION OF THE INVENTION

Figure 1:
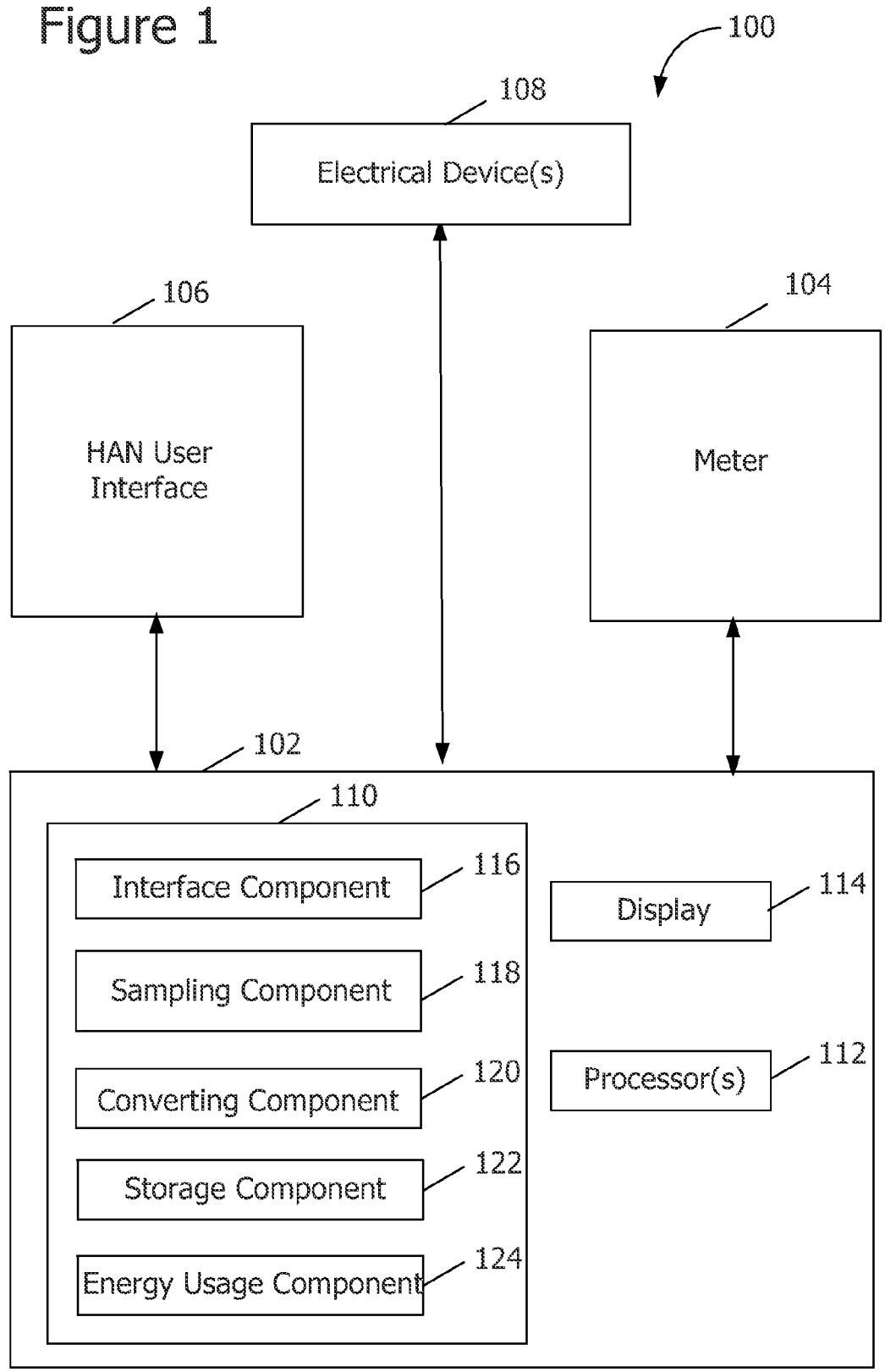
FIG. 1 is a block diagram of an electric energy measurement system.

While embodiments of the disclosure are illustrated and described herein with reference to measuring electric energy consumption, and more specifically to a system and method for generating an energy usage profile for one or more electrical devices in a home or business, aspects of the disclosure are operable with any system that performs the functionality illustrated and described herein, or its equivalent.

The two primary components of electrical bills are usage charges and demand charges. Usage refers to a quantity of electrical energy consumed, and it is measured in kilowatt-hours (kWh). Demand is a rate (e.g., a pace) at which energy is consumed, and it is measured in kilowatts (kW). Usage is often metered for each of a sequence of equal metering intervals, for example, 15 minutes to 60 minutes long. This is done for two reasons. First, usage charges can vary by a time of use, and a usage of each interval, or a particular block of intervals, can be billed at a different rate. Second, usage data are a convenient basis for demand charges. Demand charges are generally calculated from a highest average demand from any of the intervals that comprise a specified block of intervals. An average demand for an interval is simply the usage during that interval, expressed on an hourly basis. For the commonly used 15-minute interval, the usage would be multiplied by four to get the hourly demand.

More recently, various types of dynamic pricing, such as real-time energy pricing, have been introduced. Dynamic pricing provides market transparency that exposes customers to time variations in energy costs, encouraging customers to shift their electrical energy usage into periods of lower demand, and therefore, lower prices. Dynamic pricing is being increasingly used to mitigate power shortages and, in this context, it is referred to as a "demand response". Utilities and their regulators have implemented demand response as programs, which provide incentives to reduce electrical demand during power shortages ("events"). In some cases, these incentives are contingent upon a customer reducing usage below some prescribed limit during each hour or each metering interval. If the customer fails to observe these limits, the incentives may be lost, harsh penalties may be imposed, or both.

Typically, a total demand of a facility fluctuates markedly, due to many individual electrical loads turning on and off at irregular intervals. To reliably hit a demand target, a customer or an automatic control system needs accurate electrical usage. Thus, an ability to refine load control to a higher degree of resolution, for example, at an individual electrical device level, can produce greater accuracies and better performance in load control strategies a utility may potentially employ. However, because conventional electric meters can not determine an electric energy usage of individual electrical devices, for example, an HVAC system, a washing machine, a dryer, a dishwashing machine, a hybrid vehicle, a pool pump, and the like, ensuring or even verifying that a consumer has in fact reduced power usage of a specific electrical device with respect to a demand response event can be difficult. Therefore, conventional demand response events merely require a customer to reduce total electrical energy usage.

Embodiments of the present disclosure enable a utility to verify compliance with a demand response event that requests a reduction of energy consumption, and more specifically, non-usage of one or more individual electrical devices, as well as enable a consumer to have appropriate control over energy consumption. For example, embodiments of the present disclosure utilize the fact that each electrical device has a unique energy usage profile based on, for example, power consumption, duration, ramp up (e.g., during powering on of the device)/ramp down (e.g., after powering off the device), and cycling. Thus, enabling a consumer to generate an energy usage profile for each electrical device not only provides the utility an ability to determine energy usage of for each electrical device by comparing the total energy usage with each energy usage profile, but also gives the consumer a level of control and assurance that each electrical device is properly defined with an accurate and up to date energy usage profile.

An exemplary technical effect of the methods and systems described herein includes at least one of (a) receiving a request to turn off power to each of one or more electrical devices associated with a meter configured to measure electric energy usage; (b) receiving a request to turn on a first electrical device of the one or more electrical devices; (c) obtaining a sample of a ramp up waveform of energy usage of the first electrical device; (d) converting the sample of the ramp up waveform to a digital signature; and (e) storing the ramp up digital signature of the first electrical device in the memory area.

With reference to FIG. 1, a block diagram of an electric energy measurement system 100 is provided. System 100 includes a computing device 102 communicatively coupled to a meter 104 configured to measure electric energy usage, a home area network (HAN) user interface 106, and one or more electrical devices 108. Computing device 102 may be a portable computing device such as a laptop, netbook, and/or portable media player. Further, computing device 102 may include any device executing instructions (e.g., application programs), or represent a group of processing units or other computing devices. In addition, although computing device 102, meter 104, and HAN user interface 106 are shown as being separate devices in FIG. 1, features of device 102, meter 104, and HAN user interface 106 may be combined into, for example, one or more devices. For example, meter 104 may include HAN user interface 106 and/or computing device 102. Further, computing device 102 may include a user interface (e.g., HAN user interface 106).

Computing device 102 may communicate with meter 104, HAN user interface 106, and one or more electrical devices 108 via wired and/or wireless networks, for example, local area networks or global networks such as the Internet. In embodiments in which computing device 102 communicates using wireless networks, computing device 102 may be enabled with technology such as BLUETOOTH brand wireless communication services (secured or unsecured), radio frequency identification (RFID), Wi-Fi such as peer-to-peer Wi-Fi, ZIGBEE brand wireless communication services, near field communication (NFC), and other technologies that enable short-range or long-range wireless communication. In some embodiments, computing device 102 may communicate via a wireless cellular network providing Internet access.

Computing device 102 includes a memory area 110, a display 114 and at least one processor 112. Display 114 may be, for example, an LED or LCD that displays energy used. In one embodiment, display 114 may perform the functionalities of HAN user interface 106. Thus, as discussed above, HAN user interface 106 may separate from (as shown in FIG. 1) or integrated within computing device 102 as display 114. HAN user interface 106 and/or display 114 act as a user input selection device providing user input functionality. In one embodiment, HAN user interface 106 and/or display 114 may be a capacitive touch screen display configured to be responsive to a user pressing contact on a screen to selectively perform functionality. Thus, a user can operate the desired functions by contacting a surface of HAN user interface 106 and/or display 114 as well as other functions provided herein.

Memory area 110 or other computer-readable medium or media, stores components, energy usage profiles of one or more electrical devices (e.g., electrical devices 108), and a total power usage of all electrical devices associated with meter 104. Exemplary components include, but are not limited to, an interface component 116, a sampling component 118, a converting component 120, a storage component 122, and an energy usage component 124. While the components are shown to be stored in memory area 110, the components may be stored and executed from a memory area remote from computing device 102. For example, the components may be stored by a cloud service, and the output of the execution of the components may be provided to computing device 102. Such embodiments reduce the computational and storage burden on computing device 102.

As mentioned above, to enable a utility to verify compliance with a demand response event that requests a reduction of electric energy usage, and more specifically, non-usage of one or more electrical devices 108, a consumer can generate an energy usage profile for each of the one or more electrical devices 108. In one embodiment, a utility or someone other than the consumer may generate an energy usage profile for each of the one or more electrical devices 108. In another embodiment, a consumer can generate an energy usage profile for each electrical device and a utility can also generate an energy usage profile for each of the one or more electrical devices 108. Thereafter, the consumer and the utility can, for example compare results, and/or, update respective energy usage profiles based on the comparing.

Interface component 116, when executed by processor 112, causes processor 112 to receive a request to turn off power to each of the one or more electrical devices 108. Turning off power to each of the one or more electrical devices 108 enables a slew rate that is unique to each electrical device as each electrical device is turned on and off one at a time to be more accurately identified as the consumer is generating an energy usage profile for each of the one or more electrical devices 108. For example, with a plurality of electrical devices in an on state, attempting to identify a unique slew rate of a single electrical device can be difficult and/or inaccurate if completed. As such, interface component 116 when executed by processor 112, further causes processor 112 to receive a request (e.g., from a user via HAN user interface 106) to turn on a first electrical device of one or more electrical devices 108 (e.g., while each of the other electrical devices 108 are shut off from electrical power or in an off state).

Sampling component 118, when executed by processor 112, causes processor 112 to obtain (e.g., using the Nyquist sampling theorem) a ramp up waveform (see FIG. 3, 302) of energy usage of the first electrical device when the first electrical device is turned on by a user and obtain a ramp down waveform (see FIG. 3, 304) of energy usage of the first electrical device when the first electrical device is turned off. That is, sampling component 118 enables an energy usage of the first electrical device to be sampled at an appropriate sample rate such that the ramp up waveform and the ramp down waveform are captured. In one embodiment, sampling component 118 enables a sample-and-hold circuit to capture an energy usage profile of a given electrical device at a sufficient sample rate when triggered by, for example, a control circuit communicatively coupled to HAN user interface 106.

Converting component 120, when executed by processor 112, causes processor 112 to convert the ramp up waveform and the ramp down waveform to respective digital signatures unique to the first electrical device using, for example, an analog-to-digital converter. One or more of the digital signatures associated with the first electrical device can thereafter be used to obtain electrical usage information specific to the first electrical device. In one embodiment, the analog-to-digital converter is operatively connected to a sample-and-hold circuit for transforming the captured analog signal into a digital signature of an energy usage profile.

Storage component 122, when executed by processor 112, causes processor 112 to store the ramp up digital signature and the ramp down digital signature of the first electrical device in memory area 110. In one embodiment, the digital signatures stored in memory 110 are the most recent digital signatures. Thus, if a digital signature to an electrical device is currently stored in memory area 110, and another digital signature is generated, the newly generated digital signature may replace the old digital signature. In another embodiment, memory area 110 stores all generated digital signatures, old and new. Furthermore, memory area may store energy usage profiles including digital signatures as directed by a consumer. For example, a consumer may own two hybrid cars that use a same charging station. Thus, when generating an energy usage profile for each car, the consumer may store each digital signature separately and not merely replace one digital signature for the other. However, if the user has sold one hybrid car and purchased a new one, the consumer may desire to delete the previously owned hybrid car's energy usage profile/digital signature all together.

Energy usage component 124, when executed by processor 112, causes processor 112 to compare a total power usage all electrical devices associated with meter 104 with the ramp up digital signature and/or the ramp down digital signature of the first electrical device. Energy usage component 124 further causes processor 112 to determine, based on the comparing, whether the first electrical device was turned on, and if so, for how long, during a specified period of time. As such, a utility is able to verify compliance with a demand response event that, for example, under a contractual agreement or a voluntarily, requests a reduction of electric energy consumption, and more specifically, non-usage of individual electrical devices. For example, energy usage component 124 may recognize a digital signature of the ramp up waveform and track usage of a corresponding electrical device so that the utility can charge the consumer for violating the terms of the agreement.

Processor 112 executes computer-executable instructions for implementing aspects of the disclosure. In some embodiments, processor 112 is transformed into a special purpose microprocessor by executing computer-executable instructions or by otherwise being programmed For example, processor 112 is programmed with instructions such as illustrated below with respect to FIG. 2.

Figure 2:
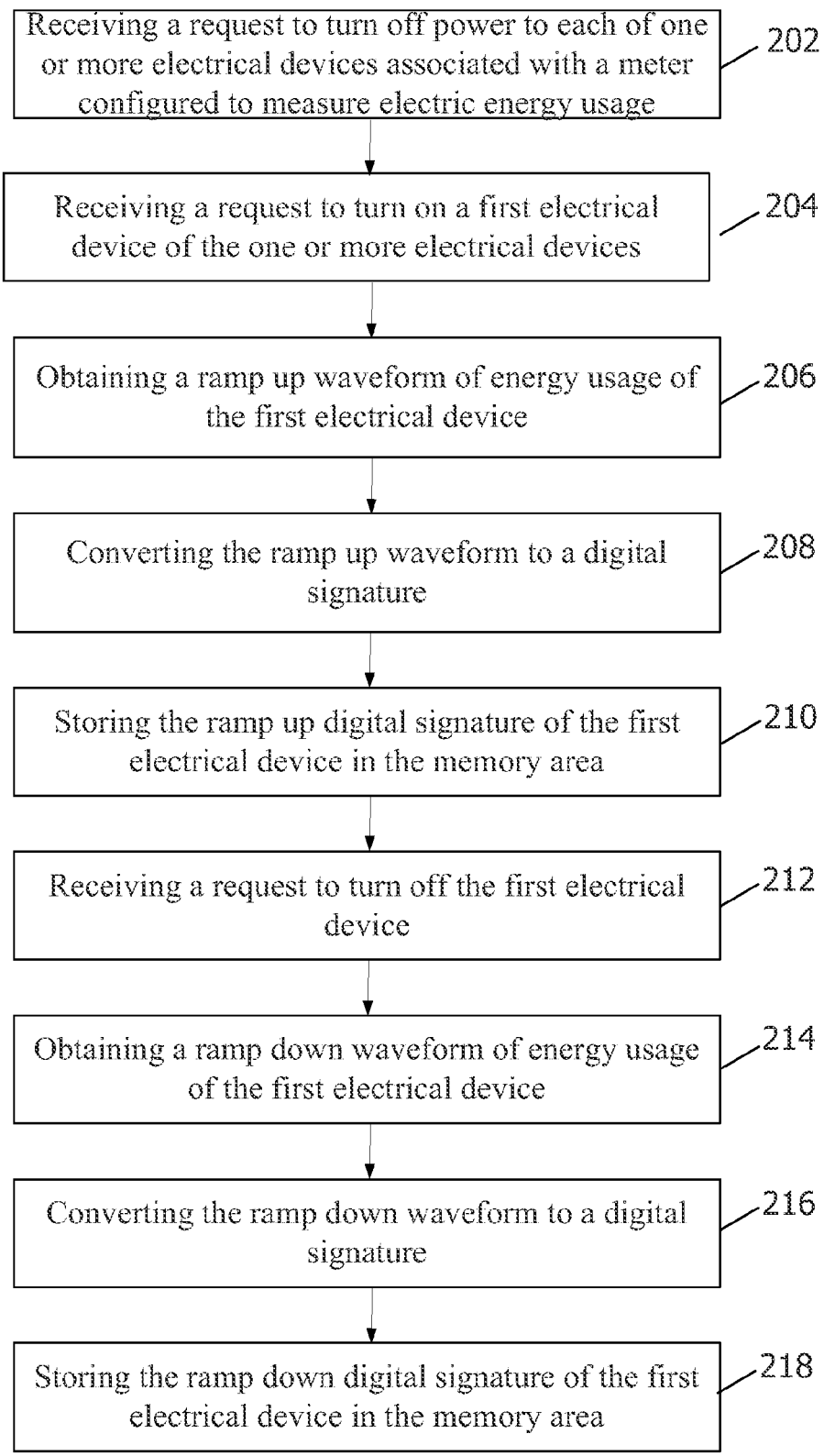
FIG. 2 is a process flow diagram of a method for generating an energy usage profile for an electrical device.
Figure 3:
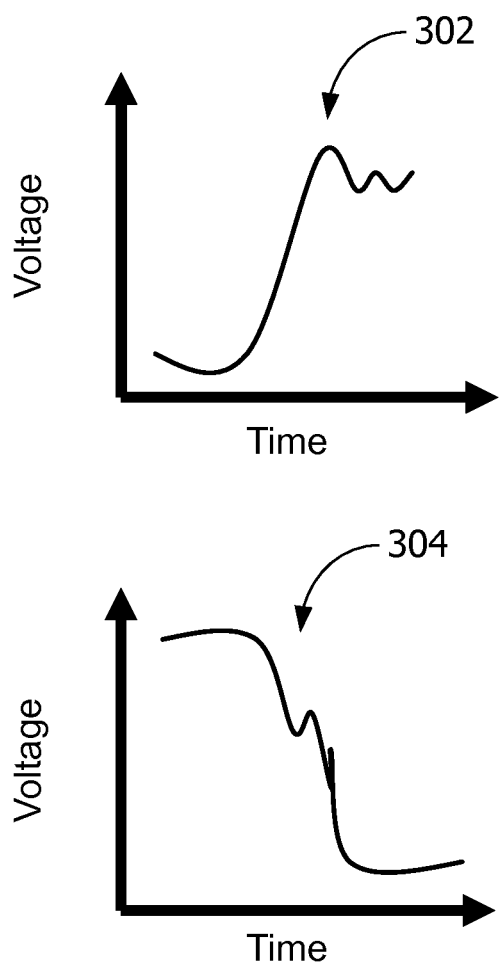
FIG. 3 provide an illustrative example of a ramp up waveform and a ramp down waveform.

Referring next to FIG. 2, an exemplary flow chart illustrates generating an energy usage profile for an electrical device (e.g., one of one or more electrical devices 108). At 202, a request to turn off power to each of the one or more electrical devices 108 is received. As mentioned above, turning off power to each of the one or more electrical devices 108 enables a slew rate that is unique to an electrical device to be more accurately identified when the electrical device is turned on and off (e.g., while the consumer is generating an energy usage profile for each of the one or more electrical devices 108). At 204, a request to turn on a first electrical device of one or more electrical devices 108 is received. At 206, a ramp up waveform of energy usage of the first electrical device is obtained. In one embodiment, the Nyquist sampling theorem is used to capture the waveform of energy usage. However, one of ordinary skill in the art guided by the teachings herein will appreciate that a waveform can be captured using other theorems that provide an appropriate sample rate such that the ramp up waveform and the ramp down waveform are captured. An exemplary ramp up waveform of an electrical device is shown in FIG. 3, at 302. At 208, the ramp up waveform is converted to a digital signature using, for example, an analog-to-digital converter. At 210, the ramp up digital signature of the first electrical device is stored in, for example, memory area 110. At 212, a request to turn off the first electrical device of one or more electrical devices 108 is received. At 214, a ramp down waveform of energy usage of the first electrical device is obtained. An exemplary ramp down waveform of an electrical device is shown in FIG. 3, at 304. At 216, the ramp down waveform is converted to a digital signature. At 218, the ramp down digital signature of the first electrical device is stored in, for example, memory area 110.

Once the energy usage profiles have been generated, a utility is able to determine which electrical devices were used during a specified period of time. For example, a total power usage of a home or business may be compared with the ramp up digital signature and/or a ramp down digital signature of each electrical device associated with the home or business. Based on the comparing, the total power usage of each electrical device can be determined as well as when each electrical device was turned on and off.

In one embodiment, while a utility may store a generated energy usage profile for each electrical device, a utility may also access energy usage profiles stored by a consumer in, for example, memory area 110. The utility may then, compare a total power usage of each electrical device that has an energy usage profile generated by the consumer to a total power usage of a house or business associated with each electrical device that has an energy usage profile. This enables the utility to compare energy usage information it may have created based on energy usage profiles stored by the utility, with energy usage information created from energy usage profiles stored by the consumer, enabling a checks-and-balance between the two parties.

Exemplary Operating Environment

A controller or computing device such as is described herein has one or more processors or processing units, system memory, and some form of computer readable media. By way of example and not limitation, computer readable media include computer storage media and communication media. Computer storage media include volatile and nonvolatile, removable and non-removable media implemented in any method or technology for storage of information such as computer readable instructions, data structures, program modules or other data. Communication media typically embody computer readable instructions, data structures, program modules, or other data in a modulated data signal, such as a carrier wave or other transport mechanism, and include any information delivery media. Combinations of any of the above are also included within the scope of computer readable media.

The controller/computer may operate in a networked environment using logical connections to one or more remote computers, such as a remote computer. Although described in connection with an exemplary computing system environment, embodiments of the present disclosure are operational with numerous other general purpose or special purpose computing system environments or configurations. The computing system environment is not intended to suggest any limitation as to the scope of use or functionality of any aspect of the present disclosure. Moreover, the computing system environment should not be interpreted as having any dependency or requirement relating to any one or combination of components illustrated in the exemplary operating environment. Examples of well known computing systems, environments, and/or configurations that may be suitable for use with aspects of the present disclosure include, but are not limited to, personal computers, server computers, hand-held or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Embodiments of the present disclosure may be described in the general context of computer-executable instructions, such as program modules, executed by one or more computers or other devices. The computer-executable instructions may be organized into one or more computer-executable components or modules. Generally, program modules include, but are not limited to, routines, programs, objects, components, and data structures that perform particular tasks or implement particular abstract data types. Aspects of the present disclosure may be implemented with any number and organization of such components or modules. For example, aspects of the present disclosure are not limited to the specific computer-executable instructions or the specific components or modules illustrated in the figures and described herein. Other embodiments of the present disclosure may include different computer-executable instructions or components having more or less functionality than illustrated and described herein. Aspects of the present disclosure may also be practiced in distributed computing environments where tasks are performed by remote processing devices that are linked through a communications network. In a distributed computing environment, program modules may be located in both local and remote computer storage media including memory storage devices.

Aspects of the present disclosure transform a general-purpose computer into a special-purpose computing device when configured to execute the instructions described herein.

The order of execution or performance of the operations in embodiments of the present disclosure illustrated and described herein is not essential, unless otherwise specified. That is, the operations may be performed in any order, unless otherwise specified, and embodiments of the present disclosure may include additional or fewer operations than those disclosed herein. For example, it is contemplated that executing or performing a particular operation before, contemporaneously with, or after another operation is within the scope of aspects of the present disclosure.

When introducing elements of aspects of the present disclosure or the embodiments thereof, the articles "a," "an," "the," and "said" are intended to mean that there are one or more of the elements. The terms "comprising," "including," and "having" are intended to be inclusive and mean that there may be additional elements other than the listed elements.

Having described aspects of the present disclosure in detail, it will be apparent that modifications and variations are possible without departing from the scope of aspects of the present disclosure as defined in the appended claims. As various changes could be made in the above constructions, products, and methods without departing from the scope of aspects of the present disclosure, it is intended that all matter contained in the above description and shown in the accompanying drawings shall be interpreted as illustrative and not in a limiting sense.

This written description uses examples to disclose the claimed subject matter, including the best mode, and also to enable any person skilled in the art to practice the claimed subject matter, including making and using any devices or systems and performing any incorporated methods. The patentable scope of the present disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A system for generating an energy usage profile of an electrical device, the system comprising:
    a meter configured to measure electrical usage;
    a memory area for storing a plurality of ramp up digital signatures corresponding to a plurality of electrical devices associated with the electric meter; and
    at least one processor programmed to:
        receive a demand response event requesting a determination as to whether a first electrical device of the plurality of electrical devices was used during a specified period of time;
        access, from the memory area, a total power usage of the plurality of electrical devices during the specified period of time and the ramp up digital signature of the first electrical device;
        compare the total power usage of the plurality of electrical devices with the ramp up digital signature of the first electrical device; and
        determine whether the first electrical device was activated during the specified period of time based on the comparing.

2. The system of claim 1, wherein the at least one processor is further programmed to:
receive a request to turn off the first electrical device;
obtain a ramp down waveform of energy usage of the first electrical device;
convert the ramp down waveform to a digital signature; and
store the ramp down digital signature of the first electrical device in the memory area.

3. The system of claim 1, further comprising a user interface, the user interface configured to enable a user to:
request to turn off power to each of the plurality of electrical devices associated with the meter;
request to turn on the first electrical device; and
request to turn off the first electrical device.

4. The system of claim 3, wherein the user interface is at least one of user affixed to the meter, a mobile computing device, and electronically coupled between the meter and the plurality of electrical devices.

5. The system of claim 1, wherein the at least one processor is further programmed to:
store, in the memory area, a plurality of ramp down digital signatures corresponding to the plurality of electrical devices;
access, from the memory area, a total power usage of the plurality of electrical devices during the specified period of time, the ramp up digital signature of the first electrical device, and the ramp down digital signature of the first electrical device;
compare the total power usage of the plurality of devices with the ramp up digital signature of the first electrical device and the ramp down digital signature of the first electrical device; and
determine how long the first electrical device was turned on during the specified period of time based on the comparing.

6. The system of claim 1, wherein the at least one processor is further programmed to:
receive a request to turn off power to each of the plurality of electrical devices associated with the meter;
receive a request to turn on the first electrical device of the plurality of electrical devices while each of the other of the plurality of electrical devices remain in an off state;
obtain a ramp up waveform of energy usage of the first electrical device;
convert the ramp up waveform to a digital signature; and
store the ramp up digital signature of the first electrical device in the memory area.

7. The system of claim 6, wherein a Nyquist sampling theorem is used to obtain the ramp up waveform of energy usage of the first electrical device.

8. The system of claim 1, wherein the first electrical device is one of a heating, cooling, and air conditioning system, a washing machine, a dryer, a dishwashing machine, a hybrid vehicle, and a pool pump.

9. A method comprising:
receiving a demand response event requesting a determination as to whether a first electrical device of a plurality of electrical devices was used during a specified period of time, wherein the plurality of electrical devices are associated with a meter configured to measure electric energy;
accessing a total power usage of the plurality of electrical devices during the specified period of time and the ramp up digital signature of the first electrical device;
comparing the total power usage of the plurality of electrical devices with the ramp up digital signature of the first electrical device; and
determining whether the first electrical device was activated during the specified period of time based on the comparing.

10. The method of claim 9, further comprising:
receiving a request to turn off the first electrical device;
obtaining a ramp down waveform of energy usage of the first electrical device;
converting the ramp down waveform to a digital signature; and
storing the ramp down digital signature of the first electrical device in the memory area.

11. The method of claim 9, further comprising:
accessing a total power usage of the plurality of electrical devices during the specified period of time, the ramp up digital signature of the first electrical device, and a ramp down digital signature of the first electrical device;
comparing the total power usage of the plurality of electrical devices with the ramp up digital signature of the first electrical device and the ramp down digital signature of the first electrical device; and
determining how long the first electrical device was turned on during the specified period of time based on the comparing.

12. The method of claim 9, further comprising:
receiving a request to turn off power to each of the plurality of electrical devices;
receiving a request to turn on the first electrical device of the plurality of electrical devices while each of the other of the plurality of electrical devices remain in an off state;
obtaining a ramp up waveform of energy usage of the first electrical device;
converting, by a processor, the ramp up waveform to a digital signature; and
storing the ramp up digital signature of the first electrical device in the memory area.

13. The method of claim 12, wherein the request to turn off power to the plurality of electrical devices associated with a meter configured to measure electric energy usage and the request to turn on the first electrical device of the plurality of electrical devices are received from one of a user interface affixed to the meter, a mobile computing device, and a user interface electronically coupled between the meter and the plurality of electrical devices.

14. The method of claim 9, wherein a user of the plurality of electrical devices inputs the request to turn off power to each of the plurality of electrical devices associated with a meter configured to measure electric energy usage and the request to turn on a first electrical device of the plurality of electrical devices into a user interface communicatively coupled to the plurality of electrical devices and the meter.

15. The method of claim 9 wherein the plurality of electrical devices are associated with a residence or business.

16. The method of claim 9, wherein the first electrical device is one of a heating, cooling, and air conditioning system, a washing machine, a dryer, a dishwashing machine, a hybrid vehicle, and a pool pump.

17. One or more non-transitory computer-readable media having computer-executable components, said components comprising:
an interface component that when executed by at least one processor causes the at least one processor
to receive a demand response event requesting a determination as to whether a first electrical device of a plurality of electrical devices was used during a specified period of time, wherein the plurality of electrical devices is associated with a meter configured to measure electrical usage;

a storage component that when executed by the at least one processor causes the at least one processor to access, from a memory area, a total power usage of the plurality of electrical devices during the specified period of time and the ramp up digital signature of the first electrical device; and an energy usage component that when executed by at least one processor causes the at least one processor to compare the total power usage of the plurality of electrical devices with the ramp up digital signature of the first electrical device and determine whether the first electrical device was activated during the specified period of time based on the comparing.

18. The non-transitory computer-readable media of claim 17, wherein the interface component further causes the at least one processor to receive a request to turn off the first electrical device;

wherein a sampling component that when executed by the at least one processor causes the at least one processor to obtain a ramp down waveform of energy usage of the first electrical device;

wherein a converting component that when executed by the at least one processor causes the at least one processor to convert the ramp down waveform to a digital signature; and wherein the storage component further causes the at least one processor to store the ramp down digital signature of the first electrical device in the memory area.

19. The non-transitory computer-readable media of claim 17 wherein the interface component further causes the at least one processor to receive a request to turn off power to each of the plurality of electrical devices, and receive a request to turn on the first electrical device of the plurality of electrical devices while each of the other of the plurality of electrical devices remain in an off state;

wherein a sampling component that when executed by the at least one processor causes the at least one processor to obtain a ramp up waveform of energy usage of the first electrical device;

wherein a converting component that when executed by the at least one processor causes the at least one processor to convert the ramp up waveform to a digital signature; and wherein the storage component further causes the at least one processor to store the ramp up digital signature of the first electrical device in the memory area.

20. The non-transitory computer-readable media of claim 19, wherein the converting component causes the at least one processor to convert the ramp up waveform to a digital signature using an analog-to-digital converter.

* * * * *